United States Patent [19]
Takata

[11] Patent Number: 6,046,928
[45] Date of Patent: Apr. 4, 2000

[54] NON-VOLATILE SEMICONDUCTOR MEMORY DEVICE

[75] Inventor: Hidekazu Takata, Nara, Japan

[73] Assignee: Sharp Kabushiki Kaisha, Osaka, Japan

[21] Appl. No.: 09/272,942

[22] Filed: Mar. 18, 1999

[30] Foreign Application Priority Data

Mar. 18, 1998 [JP] Japan .................................. 10-068025

[51] Int. Cl.⁷ .............................. G11C 11/22; G11C 7/00
[52] U.S. Cl. ........................... 365/145; 365/205; 365/210
[58] Field of Search .................................... 365/145, 149, 365/205, 207, 208, 210

[56] References Cited

U.S. PATENT DOCUMENTS

| | | | |
|---|---|---|---|
| 4,873,664 | 10/1989 | Eaton, Jr. ................................. | 365/145 |
| 5,539,279 | 7/1996 | Takeuchi et al. ...................... | 365/145 |
| 5,600,587 | 2/1997 | Koike ..................................... | 365/145 |
| 5,926,413 | 7/1999 | Yamada et al. ........................ | 365/145 |

FOREIGN PATENT DOCUMENTS 06223583  8/1994  Japan .

Primary Examiner—Son Mai
Attorney, Agent, or Firm—Morrison & Foerster LLP

[57] ABSTRACT

A non-volatile semiconductor memory device according to the present invention includes: a memory cell including a capacitor having a ferroelectric film interposed between and a first electrode and a second electrode, the capacitor being capable of retaining binary information responsive to the ferroelectric film taking one of first and second polarization states, and a transistor having a source, a drain, and a gate, the source being coupled to the first electrode of the capacitor; a word line coupled to the gate of the transistor; a bit line coupled to the drain of the transistor; a plate line coupled to the second electrode of the capacitor; and a sense amplifier coupled to the bit line. When performing a read operation for the memory cell, a voltage on the bit line is amplified to a supply voltage by the sense amplifier if the ferroelectric film is in the first polarization state; and the voltage on the bit line is amplified to a negative voltage by the sense amplifier if the ferroelectric film is in the second polarization state.

5 Claims, 7 Drawing Sheets

NON-VOLATILE SEMICONDUCTOR MEMORY DEVICE

BACKGROUND OF THE INVENTION

1. Field of the Invention

The present invention relates to a non-volatile semiconductor memory device for storing and retaining information, the non-volatile semiconductor memory device incorporating a capacitor which includes a ferroelectric film interposed between opposite electrodes, such that different polarization states of the ferroelectric film are utilized to enable the storage and retention of information.

2. Description of the Related Art

In general, a semiconductor memory device incorporating a ferroelectric material (hereinafter referred to as a "ferroelectric semiconductor memory device") is a non-volatile semiconductor memory device which stores and retains data based on the polarization directions of the ferroelectric film. Hereinafter, examples of conventional non-volatile ferroelectric semiconductor memory devices will be described (see, for example, Japanese Laid-open Patent Publication No. 6-223583, U.S. Pat. No. 4,873,664, and the like).

FIG. 4 is a circuit diagram illustrating a conventional non-volatile semiconductor memory device. FIG. 8 is a circuit diagram illustrating a sense amplifier 30 employed in the semiconductor memory device shown in FIG. 4. FIG. 5 is a timing diagram illustrating the timing scheme of the semiconductor memory device shown in FIG. 4. FIG. 6 is a graph showing the hysteresis characteristics of a ferroelectric film used in a capacitor in a main memory cell (hereinafter referred to as a "main memory cell capacitor") of the conventional semiconductor memory device. FIG. 7 is a graph showing the hysteresis characteristics of a ferroelectric film used in a capacitor in a dummy memory cell (hereinafter referred to as a "dummy memory cell capacitor") of the conventional semiconductor memory device.

With reference to the circuit diagram of FIG. 4 illustrating the conventional non-volatile semiconductor memory device, a bit line (BIT) 26 and a bit line (/BIT) 28 are coupled to a sense amplifier 30. Main memory cells 20a, 20b, and 20c and a dummy memory cell 46 are coupled to the bit line (BIT) 26, whereas main memory cells 20d and 20e and a dummy memory cell 36 are coupled to the bit line(/BIT) 28.

The main memory cell 20a includes a MOS transistor 24 and a main memory cell capacitor 22. The main memory cell capacitor 22 includes a ferroelectric film interposed between first and second electrodes. A gate of the MOS transistor 24 is coupled to a word line 32; a drain of the MOS transistor 24 is coupled to the bit line (BIT) 26; and a source of the MOS transistor 24 is coupled to the first electrode of the main memory cell capacitor 22. The second electrode of the main memory cell capacitor 22 is coupled to a cell plate line 34.

Similarly, the dummy memory cell 36 includes a MOS transistor 38 and a dummy memory cell capacitor 40. The dummy memory cell capacitor 40 includes a ferroelectric film interposed between first and second electrodes. A gate of the MOS transistor 38 of the dummy memory cell 36 is coupled to a dummy word line 42; a drain of the MOS transistor 38 is coupled to the bit line (/BIT) 28; and a source of the MOS transistor 38 is coupled to the first electrode of the dummy memory cell capacitor 40. The second electrode of the dummy memory cell capacitor 40 is coupled to a dummy cell plate line 44.

As shown in FIG. 8, the sense amplifier 30 includes p-MOS transistors 110, 111, and 112; and n-MOS transistors 118 and 120. Reference numerals 114 and 116 respectively correspond to the bit line (BIT) 26 and the bit line (/BIT) 28.

Hereinafter, the operation of the above conventional non-volatile semiconductor memory device will be described with reference to the timing diagram shown in FIG. 5, the graph of FIG. 6 showing the hysteresis characteristics of the ferroelectric film in a main memory cell capacitor, and the graph of FIG. 7 showing the hysteresis characteristics of the ferroelectric film in a dummy memory cell capacitor.

In each of the hysteresis characteristics graphs of FIGS. 6 and 7, the horizontal axis represents an electric field which is applied to the memory cell capacitor, with the corresponding charge being represented on the vertical axis. As seen from FIGS. 6 and 7, a capacitor incorporating a ferroelectric film functions in such a manner that a remanent polarization exists (as indicated at points B, E, H, and K) even when the applied field is zero. In a non-volatile semiconductor memory device, such remanent polarization is utilized for retaining data in a non-volatile manner. The main memory cell capacitor takes a state at point B (FIG. 6) when data "1" is stored in the memory cell, and takes a state at point E (FIG. 6) when data "0" is stored in the memory cell. The dummy memory cell capacitor takes an initial state at point K (FIG. 7). For the sake of explanation, it is assumed that the bit line (BIT) 26 and the bit line (/BIT) 28, the word line 32, the dummy word line 42, the cell plate line 34 and the dummy cell plate line 44 are at a logic voltage "L" (=ground potential "GND") during an initial state which exists before a reading of the data in the main memory cell occurs; thereafter, the bit line (BIT) 26 and the bit line (/BIT) 28 are placed in a floating state; and an inverted sense signal (/SE) is at a logic voltage "H" (=supply voltage "Vcc").

Next, as shown in FIG. 5, the word line 32, the dummy word line 42, the cell plate line 34 and the dummy cell plate line 44 all shift to their respective logic voltages "H". It is assumed that the logic voltage "H" for the word line 32 is a high voltage (Vpp) obtained by elevating the supply voltage (Vcc), whereas the logic voltages "H" for dummy word line 42, the cell plate line 34, and the dummy cell plate line 44 are the supply voltage (Vcc). Thus, the MOS transistor 24 of the main memory cell 20a and the MOS transistor 38 of the dummy memory cell 36 are turned on so that an electric field is applied across the main memory cell capacitor 22 and the dummy memory cell capacitor 40. If data "1" is stored in the main memory cell, the state of the main memory cell shifts from point B to point D (FIG. 6) so that the difference Q1 between the charges at point B and point D is read out, which appears as a voltage on the bit line (BIT) 26. The state of the dummy memory cell shifts from point K to point J (FIG. 7) so that the difference Qd between the charges at point K and point J is read out, which appears as a voltage on the bit line (/BIT) 28. Then, the inverted sense signal (/SE) shifts to its logic voltage "L" (i.e., the ground voltage), so that the difference between the voltage from the main memory cell which has been read onto the bit line (BIT) 26 and the voltage from the dummy memory cell which has been read onto the bit line (/BIT) 28 is amplified by the sense amplifier 30, and the bit line (BIT) 26 is brought up to the supply voltage level (Vcc) and the bit line (/BIT) 28 is brought down to the ground voltage level (GND). Thus, the data "1" in the main memory cell is read.

On the other hand, if data "0" is stored in the main memory cell, the state of the main memory cell shifts from point E to point D (FIG. 6) so that the difference Q0 between the charges at point E and point D is read out, which appears as a voltage on the bit line (BIT) 26. The state of the dummy memory cell shifts from point K to point J (FIG. 7) so that the difference Qd between the charges at point K and point J is read out, which appears as a voltage on the bit line (/BIT) 28. Then, the difference between the voltage from the main memory cell which has been read onto the bit line (BIT) 26 and the voltage from the dummy memory cell which has been read onto the bit line (/BIT) 28 is amplified by the sense amplifier 30, and the bit line (BIT) 26 is lowered to the ground voltage level (GND) and the bit line (/BIT) 28 is brought up to the supply voltage level (Vcc). Thus, the data "0" in the main memory cell is read.

As a result of the amplification by the sense amplifier 30, the bit line (BIT) 26 is placed at the supply voltage level (Vcc) when data "1" is stored in the main memory cell, the cell plate line 34 also being at the supply voltage level (Vcc). As a result, no electric field is applied across the main memory cell capacitor 22 (point E in FIG. 6). Thereafter, in order to restore the data stored in the main memory cell capacitor 22 to point B, the cell plate line 34 is placed at the ground voltage (point A in FIG. 6), and then the word line 32 is placed at its logic voltage "L". As a result, no electric field is applied across the main memory cell capacitor 22 (back to point B in FIG. 6). Thus, the data "1" has been rewritten to the main memory cell. Usually, in the state corresponding to point A, the elevated voltage (Vpp) is supplied to the word line 32 so that the logic voltage "H" on the bit line (BIT) 26 is sufficiently supplied to the main memory cell capacitor 22.

Similarly, when data "0" is stored in the main memory cell, the bit line (BIT) 26 is at the ground voltage, whereas the cell plate line 34 is at the supply voltage level (Vcc). Therefore, the main memory cell capacitor 22 is at point D in FIG. 6. Thereafter, the cell plate line 34 is placed at its logic voltage "L", so that no electric field is applied across the main memory cell capacitor 22 (point E in FIG. 6). Then, the word line 32 is placed at its logic voltage "L", but no electric field is still applied across the main memory cell capacitor 22, so that the main memory cell remains at point E in FIG. 6. Thus, the data "0" has been rewritten to the main memory cell.

With respect to the dummy memory cell, when data "1" is stored in the main memory cell, the bit line (/BIT) 28 is at the ground voltage (GND) and the dummy cell plate line 44 is at the supply voltage (Vcc), so that the dummy memory cell capacitor 40 is at point J in FIG. 7. Thereafter, as the dummy word line 42 is placed at the ground voltage, the dummy cell plate line 44 is also concurrently placed at the ground voltage. As a result, no electric field is applied across the dummy memory cell capacitor 40 (back to point K in FIG. 7).

Similarly, when data "0" is stored in the main memory cell, the bit line (/BIT) 28 is at the supply voltage (Vcc) and the dummy cell plate line 44 is also at the supply voltage (Vcc), so that the dummy memory cell capacitor 40 is at point K in FIG. 7. Thereafter, as the dummy word line 42 is placed at the ground voltage, the dummy cell plate line 44 is also concurrently placed at the ground voltage, but still no electric field is applied across the dummy memory cell capacitor 40, so that the dummy memory cell remains at point K in FIG. 7. Thus, data has been rewritten to the dummy memory cell.

However, the above-described conventional non-volatile semiconductor memory device has the following problem:

Since the sense amplifier sense-amplifies the lower voltage levels of the bit lines only to the ground voltage in the conventional non-volatile semiconductor memory device, it is difficult to attain sufficient polarization in the memory cell capacitor. As a result, in the case where data "0" is stored in the main memory cell, it is impossible to provide a large voltage margin between the bit lines during a sense operation.

SUMMARY OF THE INVENTION

A non-volatile semiconductor memory device according to the present invention includes: a memory cell including: a capacitor having a ferroelectric film interposed between and a first electrode and a second electrode, the capacitor being capable of retaining binary information responsive to the ferroelectric film taking one of first and second polarization states, and a transistor having a source, a drain, and a gate, the source being coupled to the first electrode of the capacitor; a word line coupled to the gate of the transistor; a bit line coupled to the drain of the transistor; a plate line coupled to the second electrode of the capacitor; and a sense amplifier coupled to the bit line, wherein, when performing a read operation for the memory cell, a voltage on the bit line is amplified to a supply voltage by the sense amplifier if the ferroelectric film is in the first polarization state; and the voltage on the bit line is amplified to a negative voltage by the sense amplifier if the ferroelectric film is in the second polarization state.

In one embodiment of the invention, the nonvolatile semiconductor memory device further includes: a drive circuit coupled to the word line; and a switching section for selectively supplying one of the supply voltage and a voltage which is higher than the supply voltage to the driving circuit.

In another embodiment of the invention, the sense amplifier includes: an n-MOS transistor having a source and a gate, the source receiving the negative voltage and the gate receiving a sense signal; and a p-MOS transistor having a source and a gate, the source receiving the supply voltage and the gate receiving a signal obtained by inverting the sense signal.

In still another embodiment of the invention, the non-volatile semiconductor memory device further includes a dummy cell coupled to the sense amplifier.

In still another embodiment of the invention, the non-volatile semiconductor memory device includes a plurality of said memory cells arranged in a matrix of rows and columns.

Thus, the invention described herein makes possible the advantage of providing a non-volatile semiconductor memory device which provides an increased voltage margin between bit lines during a sense operation in the case where data "0" is stored in a main memory cell.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of examples, with reference to the accompanying figures.

Figure 1:
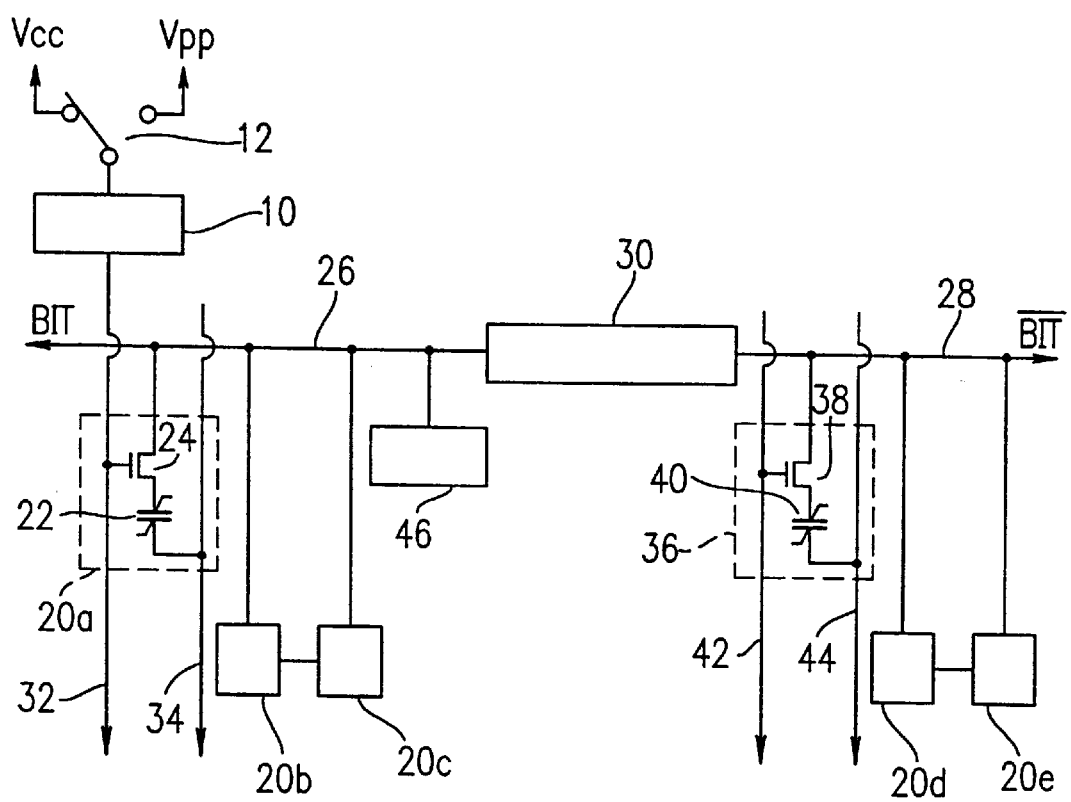
FIG. 1 is a circuit diagram illustrating a non-volatile semiconductor memory device according to an example of the present invention.
Figure 4:
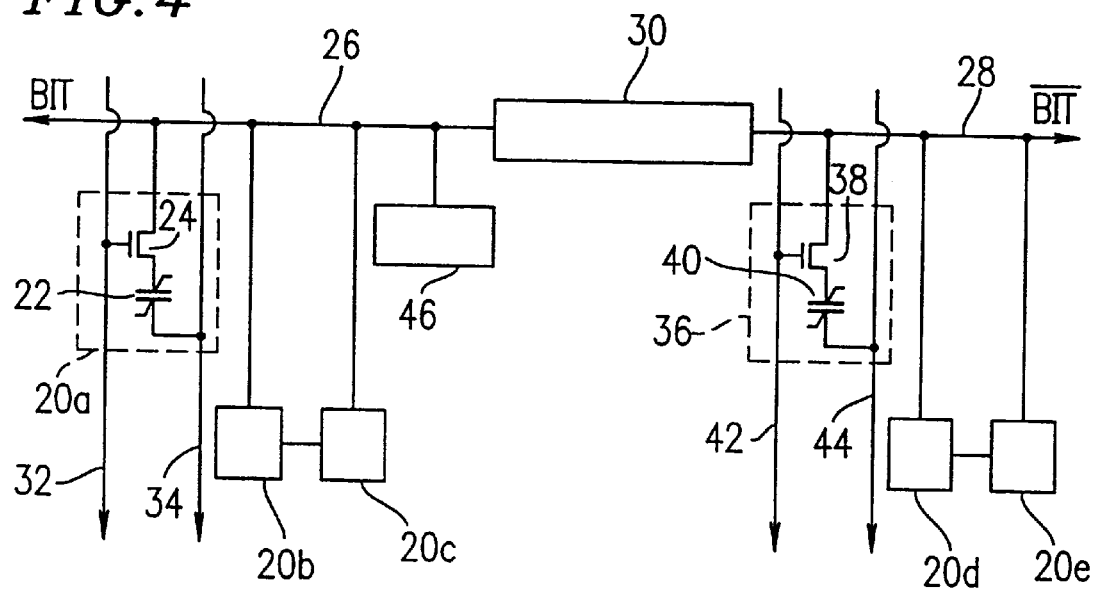
FIG. 4 is a circuit diagram illustrating a conventional non-volatile semiconductor memory device.
Figure 5:
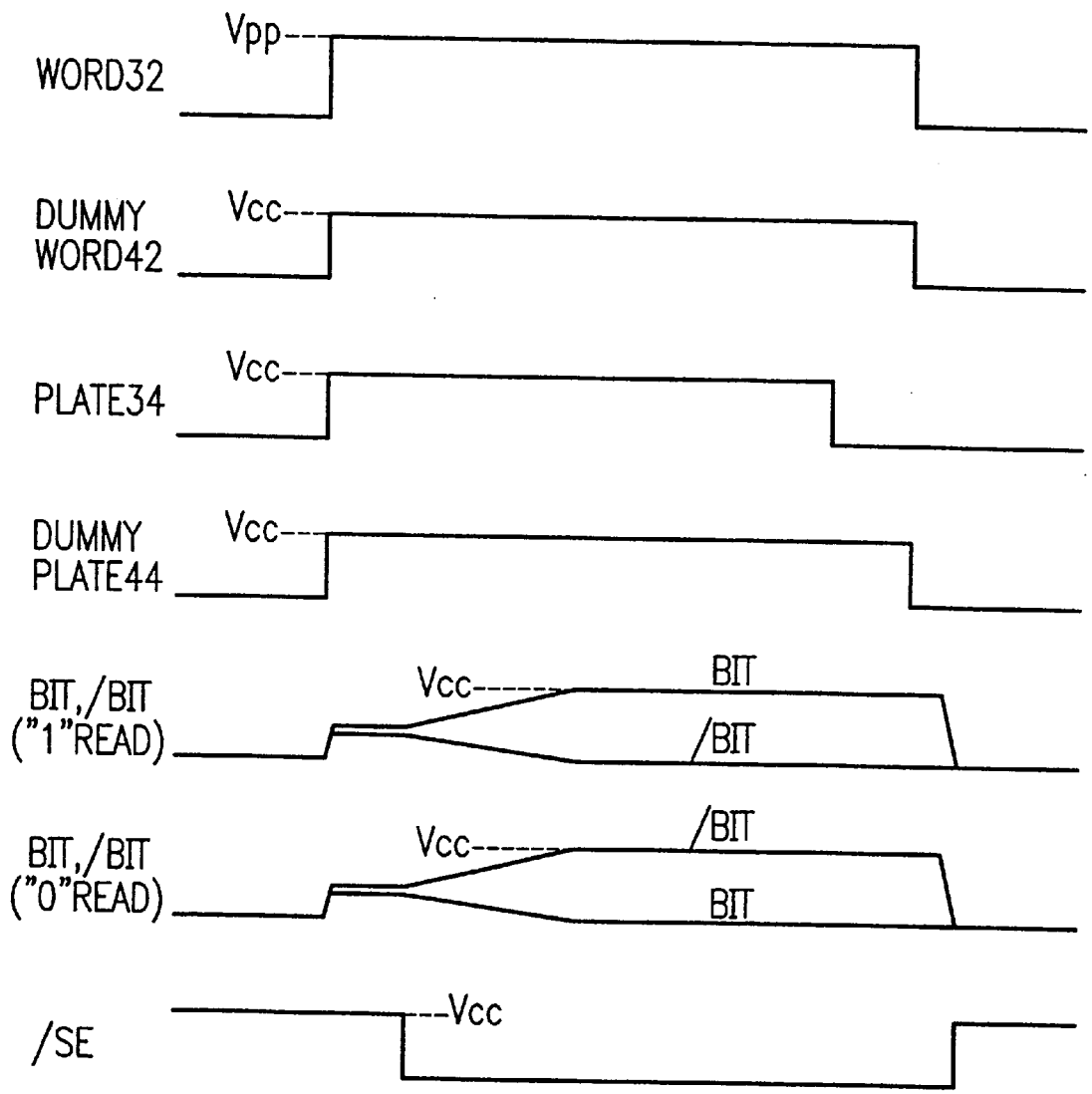
FIG. 5 is a timing diagram illustrating the timing scheme of the semiconductor memory device shown in FIG. 4.

FIG. 1 is a circuit diagram illustrating a non-volatile semiconductor memory device according to an example of the present invention. In FIG. 1, those elements which also appear in the conventional non-volatile semiconductor memory device illustrated in FIG. 4 will be denoted by the same reference numerals as used therein, and the description thereof is omitted. The non-volatile semiconductor memory device of the present invention (FIG. 1) differs from the conventional non-volatile semiconductor memory device (FIG. 4) in that it incorporates a switching section 12 for selectively supplying either a supply voltage (Vcc) or a high voltage (Vpp) which is obtained by elevating the supply voltage (Vcc), as a drive voltage to be supplied to a driving circuit 10 for driving a word line 32. The switching section 12 does not form an essential part of the present invention; alternatively, it is also possible to drive the word line always with a high voltage (Vpp), as in the prior art.

Figure 3:
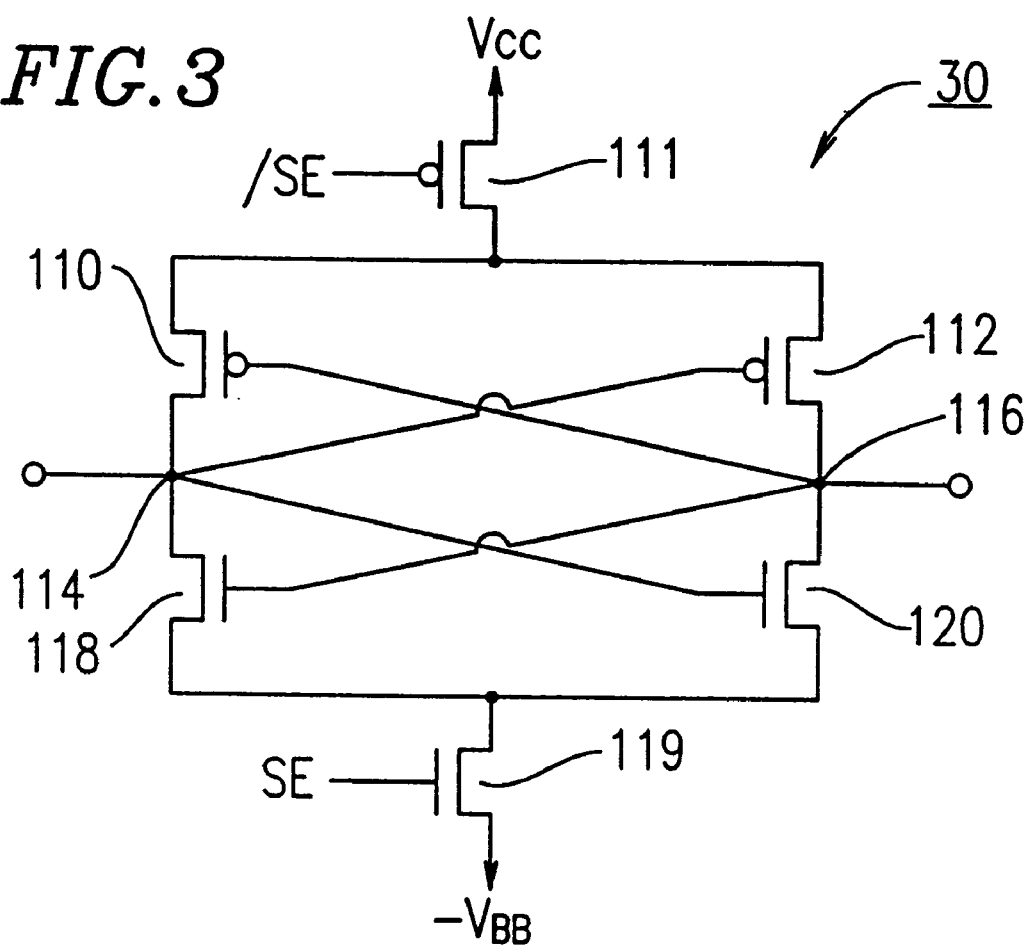
FIG. 3 is a circuit diagram illustrating a sense amplifier 30 in the semiconductor memory device shown in FIG. 1.
Figure 8:
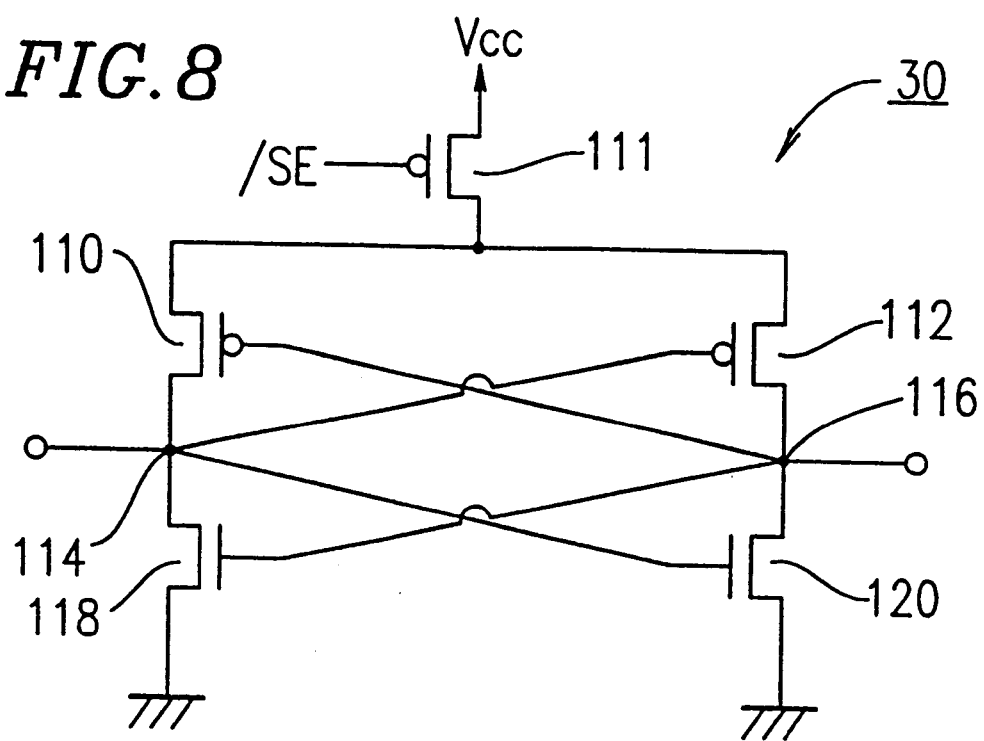
FIG. 8 is a circuit diagram illustrating a sense amplifier 30 in the semiconductor memory device shown in FIG. 4.

The non-volatile semiconductor memory device of the present invention advantageously incorporates a sense amplifier 30 shown in FIG. 3, as opposed to the sense amplifier (FIG. 8) employed in the aforementioned conventional non-volatile semiconductor memory device. The sense amplifier 30 includes p-MOS transistors 110, 111, and 112; and n-MOS transistors 118, 119, and 120.

Reference numerals 114 and 116 respectively represent a bit line (BIT) 26 and a bit line (/BIT) 28. The supply voltage (Vcc) and an inverted sense signal (/SE) are supplied to a gate and a source, respectively, of the p-MOS transistor 111. The negative voltage (−VBB) and a sense signal (SE) are supplied to a source and a gate, respectively, of the n-MOS transistor 119. Herein, a negative voltage is defined as a voltage which is in between a substrate bias voltage which is supplied to the semiconductor substrate and the ground voltage (GND).

The following description will illustrate an open bit line system, utilizing memory cells incorporating one transistor and one capacitor, where dummy cells are coupled to the bit line (/BIT) 28. However, the present invention is not limited thereto. The present invention is generally applicable to various cases where a sense amplifier is coupled to a bit line which is coupled to a selected main memory cell and the sense amplifier is also coupled to a further bit line which is coupled to a means for generating a reference level, such that the sense amplifier amplifies a potential difference between the first bit line and the further bit line.

Figure 6:
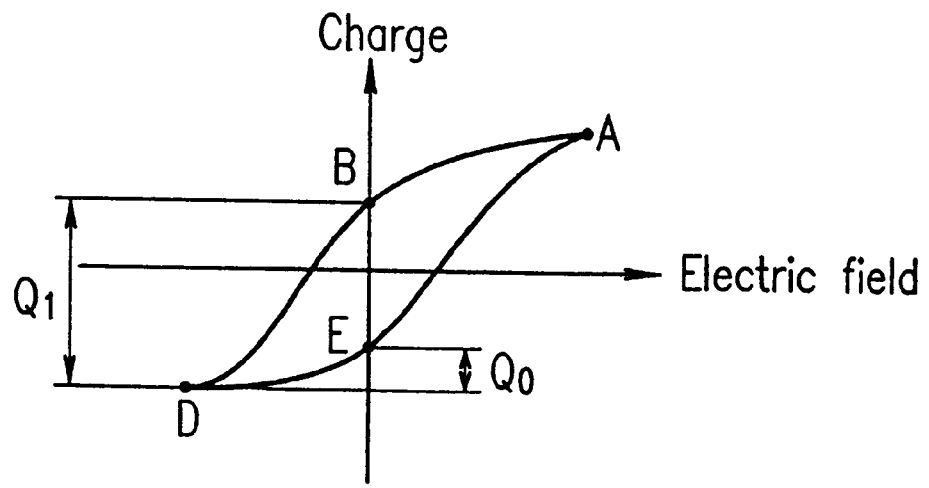
FIG. 6 is a graph showing the hysteresis characteristics of a ferroelectric film used in a main memory cell capacitor of the conventional semiconductor memory device.

Although it is assumed in the following description that the ferroelectric films of the main memory cell capacitors and the ferroelectric films of the dummy memory cell capacitors of the present invention have the hysteresis characteristics curves employed in the prior art (shown in FIG. 6 and 7, respectively), the present invention is not limited to such hysteresis characteristics.

Figure 2:
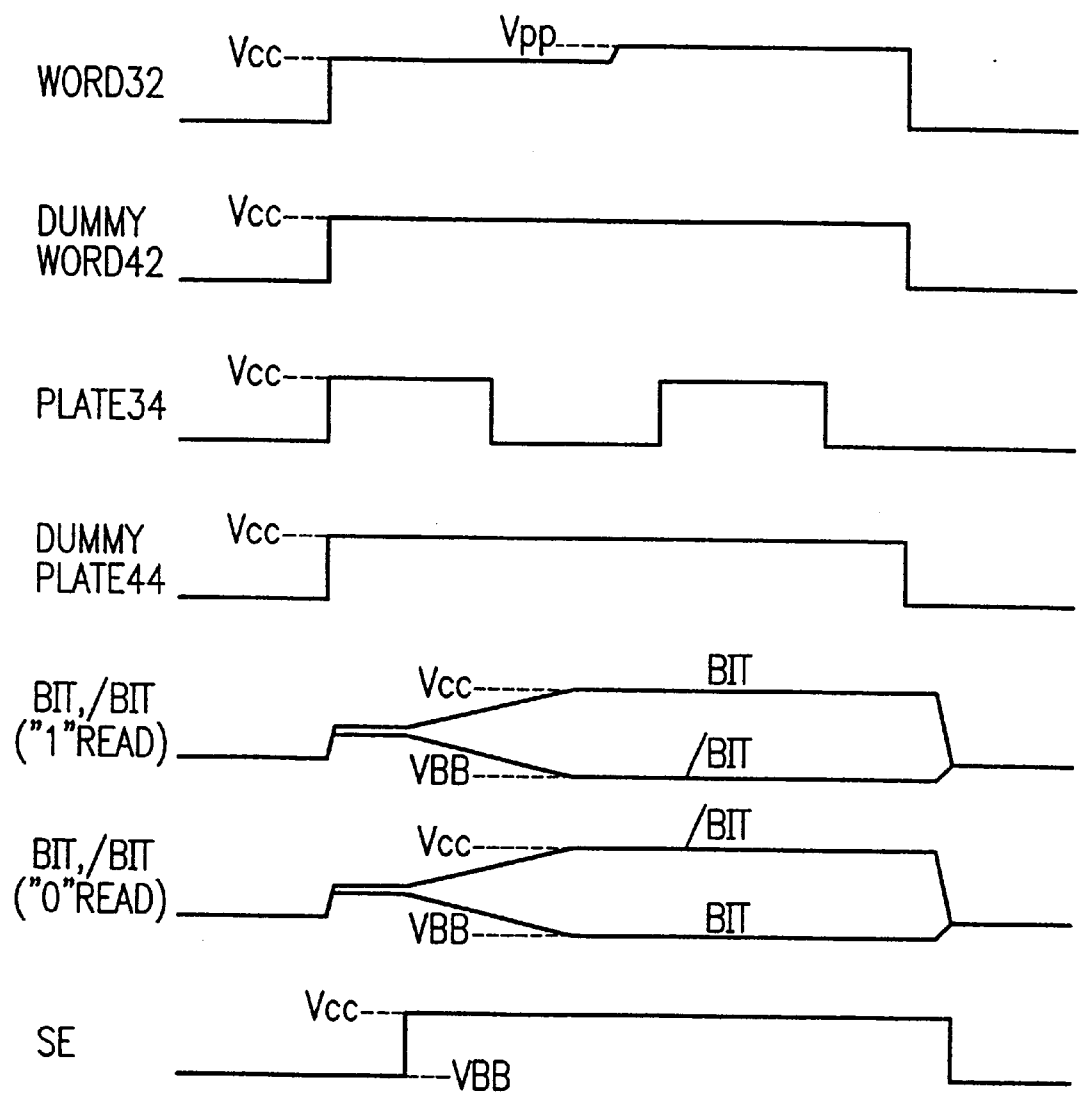
FIG. 2 is a timing diagram illustrating the timing scheme of the semiconductor memory device shown in FIG. 1.

Hereinafter, a read operation and a rewrite operation of the non-volatile semiconductor memory device according to the present example will be described with reference to the timing diagram shown in FIG. 2.

Figure 7:
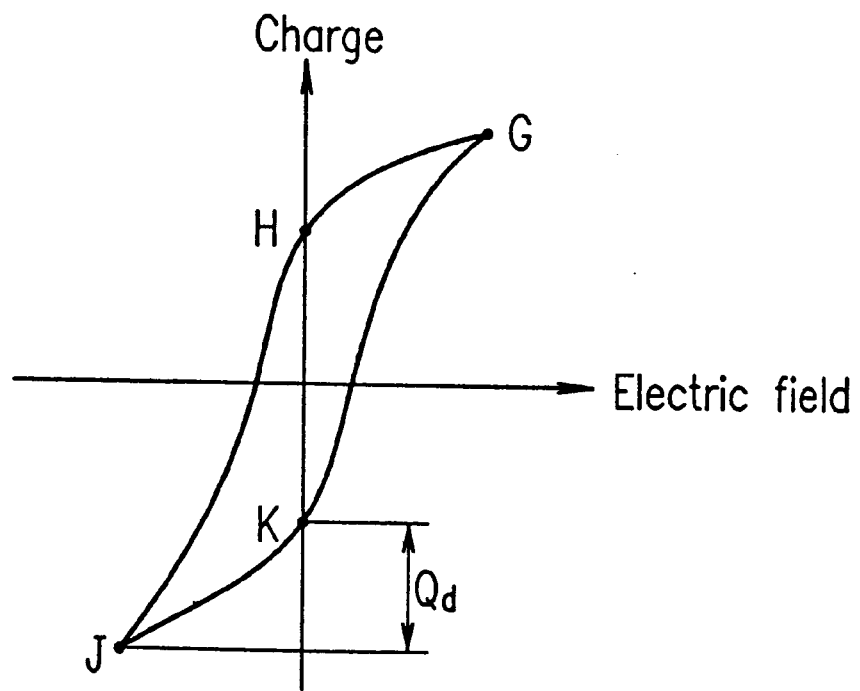
FIG. 7 is a graph showing the hysteresis characteristics of a ferroelectric film used in a dummy memory cell capacitor of the conventional semiconductor memory device.

The main memory cell capacitor 22 (FIG. 1) takes a state at point B (FIG. 6) when data "1" is stored in the memory cell, and takes a state at point E (FIG. 6) when data "0" is stored in the memory cell. The dummy memory cell capacitor takes an initial state at point K (FIG. 7). For the sake of explanation, it is assumed that the bit line (BIT) 26 and the bit line (/BIT) 28, a word line 32, a dummy word line 42, a cell plate line 34 and a dummy cell plate line 44 are at the ground voltage GND) during an initial state which exists before a reading of the data in the main memory cell occurs; thereafter, the bit line (BIT) 26 and the bit line (/BIT) 28 are placed in a floating state; and the sense signal (SE) is at a logic voltage "L".

Next, the word line 32, the dummy word line 42, the cell plate line 34 and the dummy cell plate line 44 all shift the supply voltage (Vcc). Thus, a MOS transistor 24 of the main memory cell 20a and a MOS transistor 38 of the dummy memory cell 36 are turned on so that an electric field is applied across the main memory cell capacitor 22 and the dummy memory cell capacitor 40. Since the bit line (BIT) 26 and the bit line (/BIT) 28 each have a relatively large wiring capacitance, the voltages of the bit lines (BIT) 26 and (/BIT) 28 only undergo a slight increase. As a result, the respective first electrodes of the main memory cell capacitor 22 and the dummy memory cell capacitor 40 take the same potential as that of the bit line (BIT) 26 (bit line (/BIT) 28). It should be noted that this takes place without having to apply a high voltage obtained by elevating the supply voltage (Vcc) to the word line 32 and the dummy word line 42, as required in the prior art. Since the levels of the word line 32 and the dummy word line 42 are not raised, the non-volatile semiconductor memory device of the present invention requires a smaller driving current than does the conventional non-volatile semiconductor memory device.

If data "1" is stored in the main memory cell, the state of the main memory cell shifts from point B to point D (FIG. 6) so that a potential difference equivalent to the difference Q1 between the charges at point B and point D is read out, which appears as a voltage on the bit line (BIT) 26. On the other hand, if data "0" is stored in the main memory cell, the state of the main memory cell shifts from point E to point D (FIG. 6) so that a potential difference equivalent to the difference Q0 between the charges at point E and point D is read out, which appears as a voltage on the bit line (BIT) 26. The state of the dummy memory cell shifts from point K to point J (FIG. 7) so that a potential difference equivalent to the difference Qd between the charges at point K and point J is read out, which appears as a voltage on the bit line (/BIT) 28. Herein, the values Q0, Q1, and Qd have the relationship: Q1>Qd> Q0, as reflected by the corresponding voltages which appear on the respective bit lines.

Then, as the sense signal SE from the sense amplifier 30 shifts to a logic voltage "H" (i.e., the supply voltage (Vcc)), the difference between the voltage from the main memory cell which has been read onto the bit line (BIT) 26 and the voltage from the dummy memory cell which has been read onto the bit line (/BIT) 28 is amplified by the sense amplifier 30. If data "1" is stored in the main memory cell, the voltage which has been read onto the bit line (BIT) 26 is greater than the voltage which has been read onto the bit line (/BIT) 28, so that the level of the bit line (BIT) 26 is raised toward the supply voltage (Vcc), the main memory cell shifting from point D to point E. The level of the bit line (/BIT) 28 is lowered toward the negative voltage (−VBB), the dummy memory cell further nearing point J. Then, with reference to FIG. 2, as the cell plate line 34 shifts to the ground voltage (GND), the main memory cell shifts from point E toward point A. The dummy memory cell still remains near point J because the voltage on the dummy cell plate line is maintained at the supply voltage (Vcc). On the other hand, if data "0" is stored in the main memory cell, the voltage which has been read onto the bit line (BIT) 26 is smaller than the voltage which has been read onto the bit line (/BIT) 28, so that the level of the bit line (BIT) 26 is lowered toward the negative voltage (−VBB), the main memory cell further nearing point D. The bit line (/BIT) 28 increases toward the supply voltage (Vcc), the dummy memory cell shifting from point J toward point K. Then, with reference to FIG. 2, as the cell plate line 34 shifts to the ground voltage (GND), the main memory cell shifts from point D toward point E. The dummy memory cell still remains near point K because the voltage on the dummy cell plate line 44 is maintained at the supply voltage (Vcc).

Now, a rewrite operation will be described. With reference to FIG. 2, the level of the word line 32 is first raised to the high voltage (Vpp). As a result of the amplification by the sense amplifier 30, the bit line (BIT) 26 takes the supply voltage (Vcc) if data "1" is stored in the main memory cell. Since the level of the word line 32 has been raised, the first electrode of the main memory cell capacitor 22 also takes the supply voltage (Vcc). As a result, the supply voltage (Vcc) is applied across the main memory cell capacitor in the positive direction, thereby providing a sufficient polarization up point A. At this time, the bit line (/BIT) 28 and the first electrode of the dummy memory cell capacitor 40 are at the negative voltage (−VBB), so that the dummy memory cell is at point J. Thereafter, as the level of the cell plate line 34 is brought back to the supply voltage (Vcc), the main memory cell shifts to point B. Thus, the data "1" has been rewritten.

If data "0" is stored in the main memory cell, the bit line (BIT) 26 and the first electrode of the main memory cell capacitor 22 are at the negative voltage (−VBB), so that the main memory cell is at a point between point D and point E. At this time, the bit line (/BIT) 28 and the first electrode of the dummy memory cell capacitor 40 are at the supply voltage (Vcc), so that the dummy memory cell is at point K. Thereafter, as the level of the cell plate line 34 is brought back to the supply voltage (Vcc), the main memory cell is sufficiently polarized in the negative direction, up to point D. Thus, the data "0" has been rewritten.

Finally, the word line 32, the dummy word line 42, the cell plate line 34 and the dummy cell plate line 44 are all placed at the ground voltage (GND), so that no electric field is applied across the main memory cell capacitor 22 or the dummy memory cell capacitor 40. As a result, if data "1" is stored in the main memory cell, the main memory cell takes the state at point B, the dummy memory cell taking the state at point K; if data "0" is stored in the main memory cell, the main memory cell takes the state at point E, the dummy memory cell taking the state at point K. Thus, the initial state has been rewritten to both the main memory cell capacitor 22 and the dummy memory cell capacitor 40.

As specifically described above, in accordance with the non-volatile semiconductor memory device of the present invention, the lower potential on the bit lines (BIT) 26 and (/BIT) 28 is amplified up to the negative voltage (−VBB) by the sense amplifier 30, so that a sufficient negative voltage can be supplied to the first electrode of the capacitor in the case where data "0" is stored in the main memory cell. As a result, sufficient polarization is realized, thereby providing an increased voltage margin between the bit lines during a sense operation.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A non-volatile semiconductor memory device comprising:
   a memory cell including:
      a capacitor having a ferroelectric film interposed between a first electrode and a second electrode, the capacitor being capable of retaining binary information responsive to the ferroelectric film taking one of first and second polarization states; and
      a transistor having a source, a drain, and a gate, the source being coupled to the first electrode of the capacitor;
   a word line coupled to the gate of the transistor;
   a bit line coupled to the drain of the transistor;
   a plate line coupled to the second electrode of the capacitor; and
   a sense amplifier coupled to the bit line,
   wherein, when performing a read operation for the memory cell,
      a voltage on the bit line is amplified to a supply voltage by the sense amplifier if the ferroelectric film is in the first polarization state; and
      the voltage on the bit line is amplified to a negative voltage by the sense amplifier if the ferroelectric film is in the second polarization state.

2. A non-volatile semiconductor memory device according to claim 1 further comprising:
   a drive circuit coupled to the word line; and
   a switching section for selectively supplying one of the supply voltage and a voltage which is higher than the supply voltage to the driving circuit.

3. A non-volatile semiconductor memory device according to claim 1, wherein the sense amplifier comprises:
   an n-MOS transistor having a source and a gate, the source receiving the negative voltage and the gate receiving a sense signal; and
   a p-MOS transistor having a source and a gate, the source receiving the supply voltage and the gate receiving a signal obtained by inverting the sense signal.

4. A non-volatile semiconductor memory device according to claim 1 further comprising a dummy cell coupled to the sense amplifier.

5. A non-volatile semiconductor memory device according to claim 1 comprising a plurality of said memory cells arranged in a matrix of rows and columns.

* * * * *